(12) United States Patent
Yang (10) Patent No.: US 6,405,356 B1
(45) Date of Patent: Jun. 11, 2002

(54) METHOD OF AUTOMATIC PLACEMENT FOR AN ARRAYED-ELEMENT DEVICE

(75) Inventor: Chun-Chih Yang, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/306,132

(22) Filed: May 6, 1999

(30) Foreign Application Priority Data

Nov. 20, 1998 (TW) .......................... 87119250 A (51) Int. Cl.⁷ .............................. G06F 17/50
(52) U.S. Cl. ............................ 716/10; 716/17
(58) Field of Search .................. 716/10, 17, 1; 364/490

(56) References Cited

U.S. PATENT DOCUMENTS

| | | | |
|---|---|---|---|
| 5,402,358 A | * 3/1995 | Smith et al. | 364/490 |
| 6,216,252 B1 | * 4/2001 | Dangelo et al. | 716/1 |
| 6,216,258 B1 | * 4/2001 | Mohan et al. | 716/17 |
| 6,243,851 B1 | * 6/2001 | Hwang et al. | 716/10 |

* cited by examiner

*Primary Examiner*—David Nelms
*Assistant Examiner*—Thong Le
(74) *Attorney, Agent, or Firm*—J.C. Patents (57) ABSTRACT

A method of automatic placement for an arrayed-element device, which automatically generates a schematic script for the arrayed-element device based on topological specifications, a netlist, and other parameters of the arrayed-element device, is disclosed. The generated schematic script can be loaded into an automatic place and route (P&R) tool to perform an automatic P&R which is available for RC extraction if completed so that time frame required by manual P&R and file conversion can be significantly reduced.

8 Claims, 8 Drawing Sheets

METHOD OF AUTOMATIC PLACEMENT FOR AN ARRAYED-ELEMENT DEVICE

CROSS-REFERENCE TO RELATED APPLICATION

This application claims the priority benefit of Taiwan application serial no. 87119250, filed Nov. 20, 1998, the full disclosure of which is incorporated herein by reference.

BACKGROUND OF THE INVENTION

1. Field of Invention

The present invention generally relates to a placement method for an arrayed-element device, and more particularly to an automatic placement of standard cells for an arrayed-element device, which can generate a schematic script based on a circuit topology of the arrayed-element device.

2. Description of Related Art

Thanks to the advancements from semiconductor technologies, complicated circuits with significantly improved operating speed can now be built into a single integrated circuit (IC) package.

As circuit complexities of the ICs increase, it becomes unrealistic to use a real wiring as usually adopted in the past to verify the feasibility of the designed circuitry. Nowadays, computer-aided tools are widely used to facilitate circuit designs. For example, circuits are designed based on required specifications with the help of circuit design programs. A circuit simulation program is then used to verify the logical functions of the circuits designed. When the logical functions of the designed circuit are verified as correct, a place and route (P&R) program is used to perform routings for the circuitry, so that the designed circuit can be fabricated into an IC.

Because the transmission time delay of signals between components within a circuit needs to be considered in a practical circuit, resistor and capacitor (RC) values of components in the circuit need to be extracted to perform a sdf backannotation simulation. This process is to make sure that the routing for the circuit meets the time delay requirements.

Although P&R tools and software available are powerful, there exist, however, some deficiencies in the handling of some particular circuits, for example, an arrayed-element device which has a symmetrical structure. There are many kinds of arrayed-element devices, among which is a First-In-First-Out (FIFO) memory. The FIFO memory is generally used as a data or program queue. Data or program are fed into the input ports and read from the output ports of the FIFO memory in a first-in, first-out order. To allow a correct data flow between stages in the FIFO memory, a timing sequence needs to be kept correct at all times.

Figure 1:
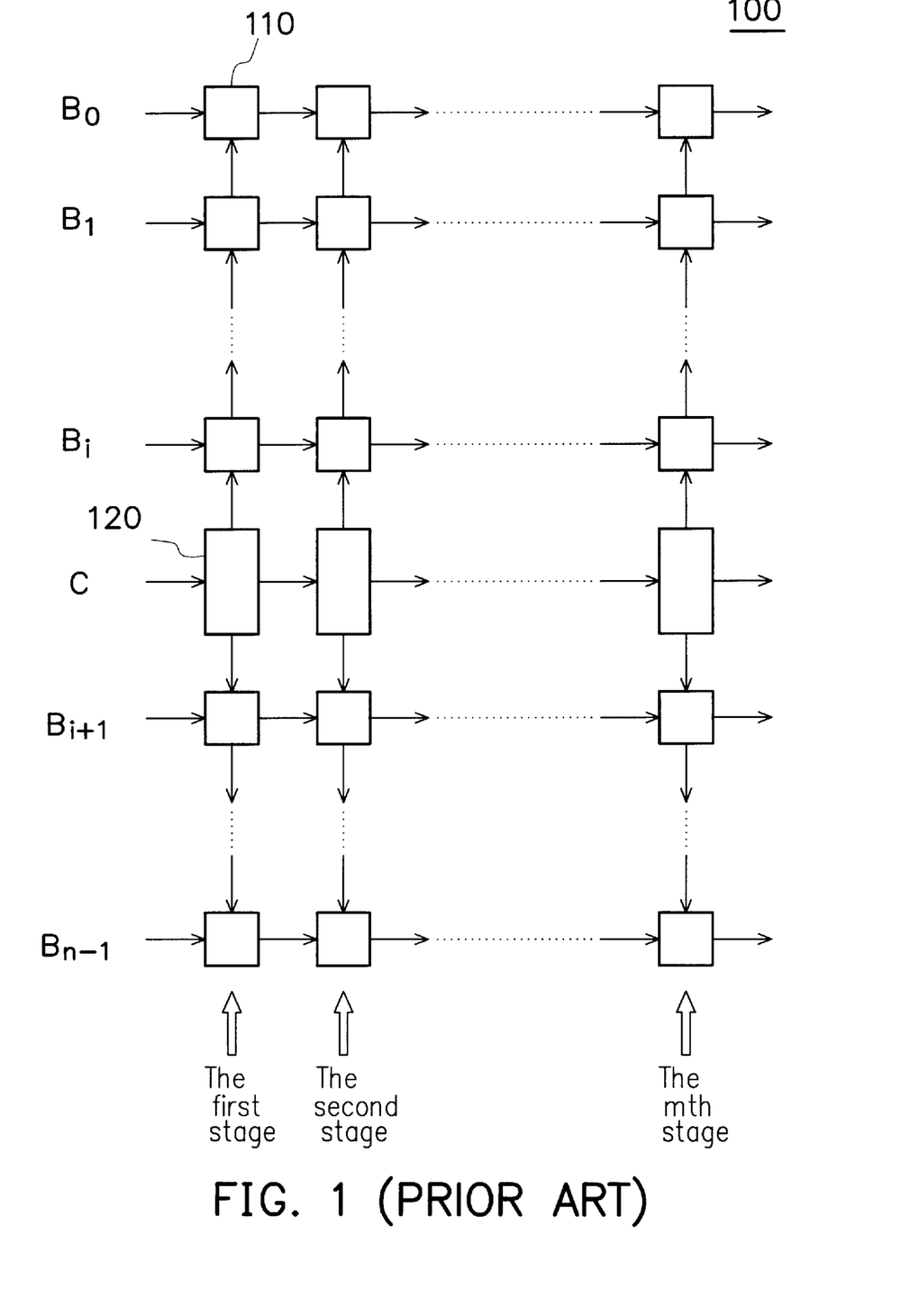
FIG. 1 is a schematic diagram showing the structure of a conventional First-In-First-Out (FIFO) memory.

FIG. 1 shows the structure of a conventional First-In-First-Out (FIFO) memory 100, which comprises an n-bits data width $B_0 \sim B_{n-1}$ and an m-stages depth. There is a plurality of data units 110 in the FIFO memory 100, each storing one-bit data. A column of data units 110 constitutes a one-stage memory, which stores n-bits of data. The data units 110 in every stage of the FIFO memory 100 are controlled by a control unit 120. To minimize the signal transmission delay, the control unit 120 is positioned in the middle each stage. Data $B_0 \sim B_{n-1}$ are propagated sequentially from the first stage through the mth stage, from which an output is obtained.

Figure 2:
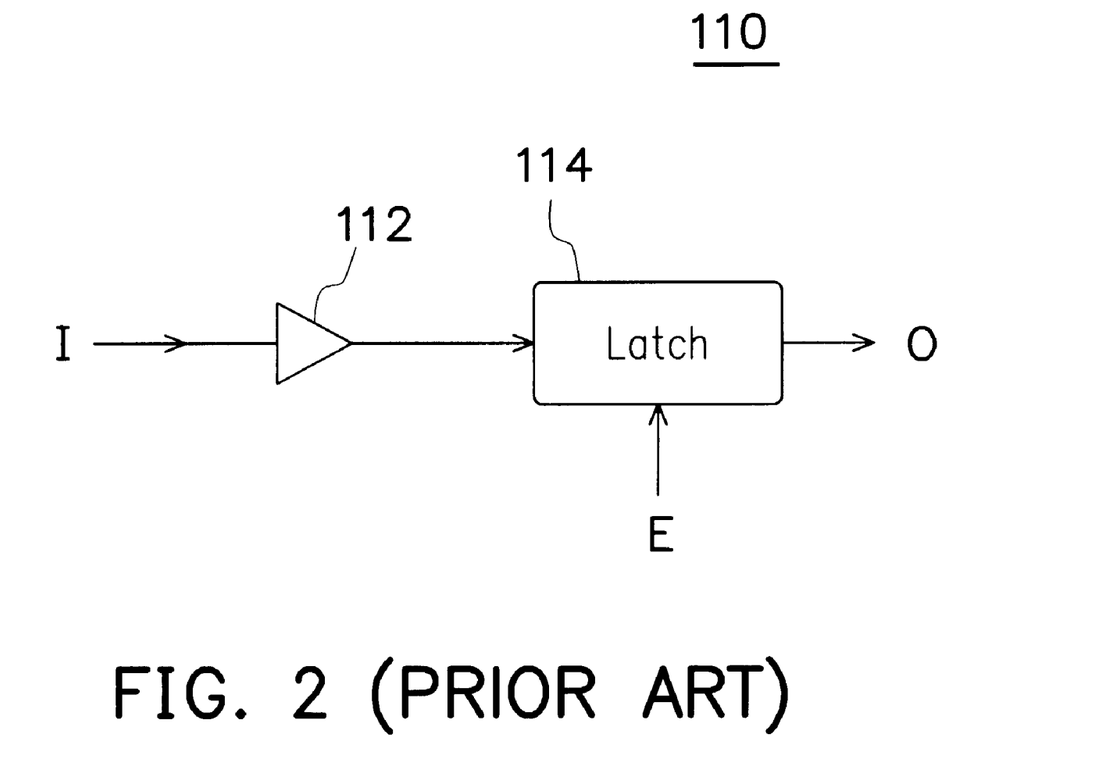
FIG. 2 is a block diagram of a data unit in the FIFO memory in FIG. 1.

FIG. 2 shows a block diagram of a data unit 110 in the FIFO memory 100 in FIG. 1. As shown in FIG. 2, the data unit 110 comprises a buffer 112 and a latch 114. The data unit 110 receives data from an input port I into the buffer 112. The latch 114, which is controlled by a control signal E, latches the data from the buffer 112 so that data can be obtained from an output port O of the latch 114.

For an arrayed-element device like the above-mentioned FIFO memory 100 in FIG. 1, which has a data width of 64 bits and a depth of 32 stages, there are 64×32 data units 110 arranged in an orderly manner. The data unit 110 latches data received from its previous stage through the control signal E. Therefore, placement of data units is essential for data to be correctly transmitted through stages in the memory. Fail to obtain a regular placement for the data units will result in an adverse effect on the smooth operation of the FIFO memory 100.

Unfortunately, automatic P&R programs generally do not take into account the above-mentioned characteristics of the arrayed-element device during the placement and routing processes. As a result, a manual, instead of automatic, placement and routing for the arrayed-element device is used in order to obtain a better performance.

Because the automatic P&R program, for example, the XO P&R tool, is not suitable for manual placement and routing, therefore other software tools, for example, the tool OPUS, are used to perform the manual placement and routing for the arrayed-element device. The arrayed-element device after placement and routing is fed into the automatic P&R tool as a hard macro, and can only be treated as a black box. The automatic P&R tool subsequently completes all the remaining placement and routing tasks for the whole IC.

Since the arrayed-element device is regarded as a black box, the RC extraction can not be directly performed. Instead, a GDS file as an interchange format needs to be created before the RC extraction can be performed to generate a standard delay format (SDF) for circuit simulation of the arrayed-element device. However, these tasks are time consuming. The manual P&R process requires a time frame of about a week per FIFO, and the conversion to a GDS file requires another 2 to 3 days for a whole chip. For an extremely tight design schedule of ICs, the time frame required for these extra tasks seriously affects the developing schedule.

As a summary, the conventional method of manual P&R for the arrayed-element device has the following disadvantages:

1. Because of the characteristics of the arrayed-element device, manual placement and routing are inevitable. Therefore, extra time frame is required, which consequently lengthens the developing schedule.
2. The arrayed-element device after manual placement and routing is regarded as a black box to be fed into the automatic P&R tool. A GDS file as an interchange format needs to be generated for a RC extraction. The conversion to the GDS file takes extra time, which delays the developing schedule of the product.

SUMMARY OF THE INVENTION

It is therefore an objective of the present invention to provide a method of automatic placement for an arrayed-element device, which automatically generates a schematic script based on topological specifications of the arrayed-element device. The schematic script can be loaded into an automatic P&R tool to perform an automatic routing so as to reduce the time required by manual P&R and file format conversion.

In accordance with the foregoing and other objectives of the present invention, a method of automatic placement for an arrayed-element device, in which standard cells are placed into rows in a circuit layout, is provided. The method comprises the steps of: loading parameters of the arrayed-element device, determining if submodules can be placed in a row for the arrayed-element device, and generating a schematic script. The schematic script can be loaded into an automatic P&R tool, which subsequently completes P&R for the whole IC.

According to a preferred embodiment of the present invention, the step of loading parameters of the arrayed-element device comprises reading in width information of standard cells, reading in topological specifications of the arrayed-element device, reading in a netlist which comprises information of a plurality of modules, and locating a top module from the netlist. When topological specifications are read in, an origin coordinate, height and width information of the standard cells, and topological information of the arrayed-element device is recorded accordingly.

When the netlist is read in, connecting ports of every module, instances within a module, space required for every module, and connecting relationship between instances are recorded accordingly.

According to a preferred embodiment of the present invention, the step of determining if submodules can be placed in a row for the arrayed-element device comprises: locating a submodule with the largest dimensions within the module, deciding whether other submodules exist, deciding if the submodule occupies only one row if there is a submodule, returning to the step of deciding whether other submodules exist if the submodule occupies more than one row, and storing all instances of the submodule into a data table if the submodule occupies only one row and then returning to the step of deciding whether other submodules exist.

Furthermore, the step of generating a schematic script comprises the steps of:
   initializing a coordinate;
   initializing a topological row variable;
   deciding whether the topological row variable is larger than the total topological rows required for placement;
   exiting if the row variable is larger than the total rows;
   performing the following steps if the topological row variable is smaller than or equal to the total rows:
   locating a first instance of the row that the row variable refers to; determining row of layout and placement method for the instance;
   generating the schematic script of all standard cells for the instance;
   deciding whether there exist any other instances in the row referred to by the row variable;
   increasing the topological row variable by one and returning to the step of deciding whether the row variable is larger than the total rows if there exists no other instances in the row referred to by the row variable; and
   locating a next instance and examining connection relationship of the next instance if there is an instance in the row referred to by the row variable, and then returning to the step of determining what number of rows is required and a placement method for the instance.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 3:
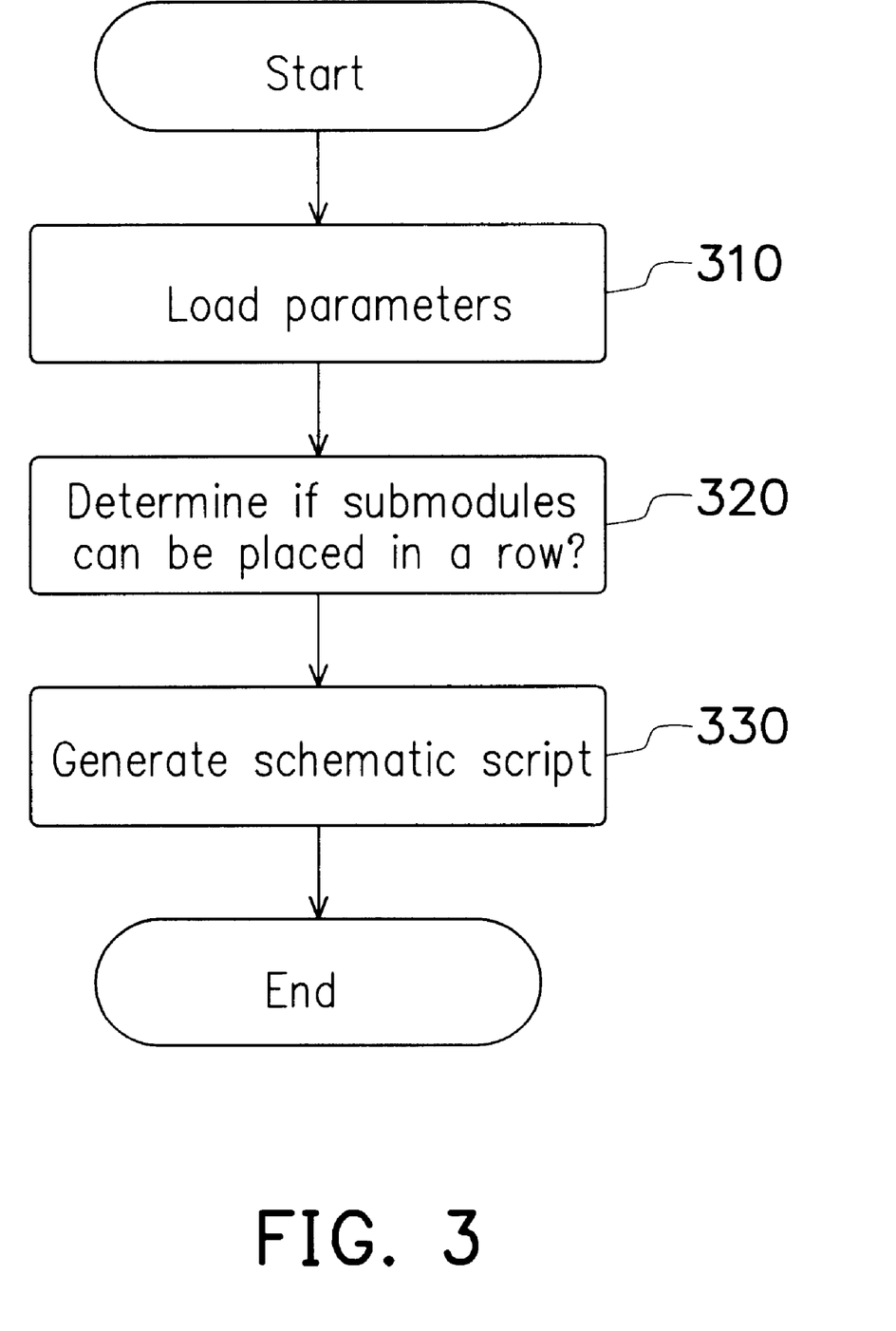
FIG. 3 is the main flow chart showing the processing steps of the method of automatic placement for an arrayed-element device according to one preferred embodiment of the present invention.
Figure 4:
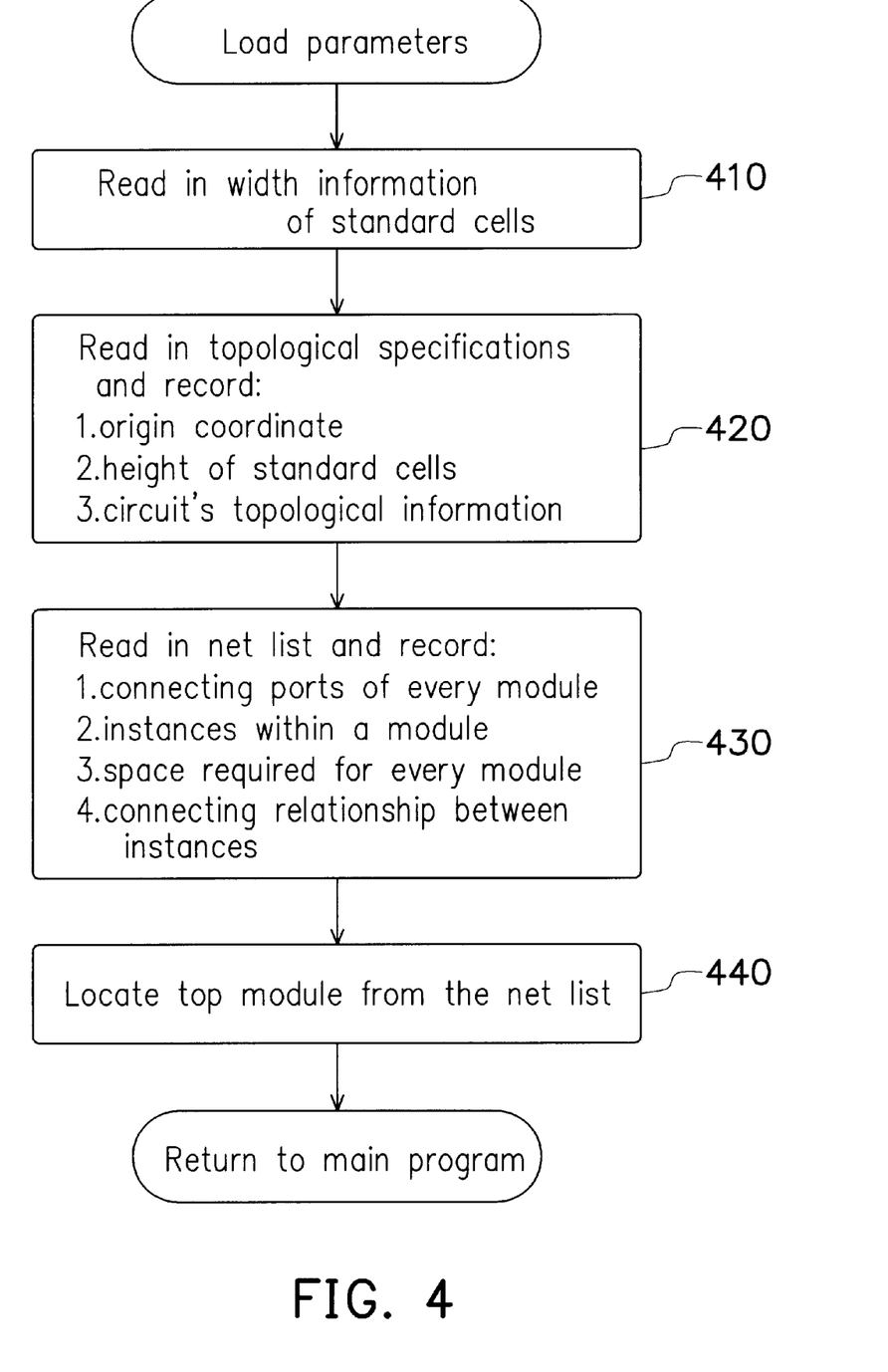
FIG. 4 is a flow chart showing the processing steps of loading parameters for the arrayed-element device in FIG. 3.
Figure 5:
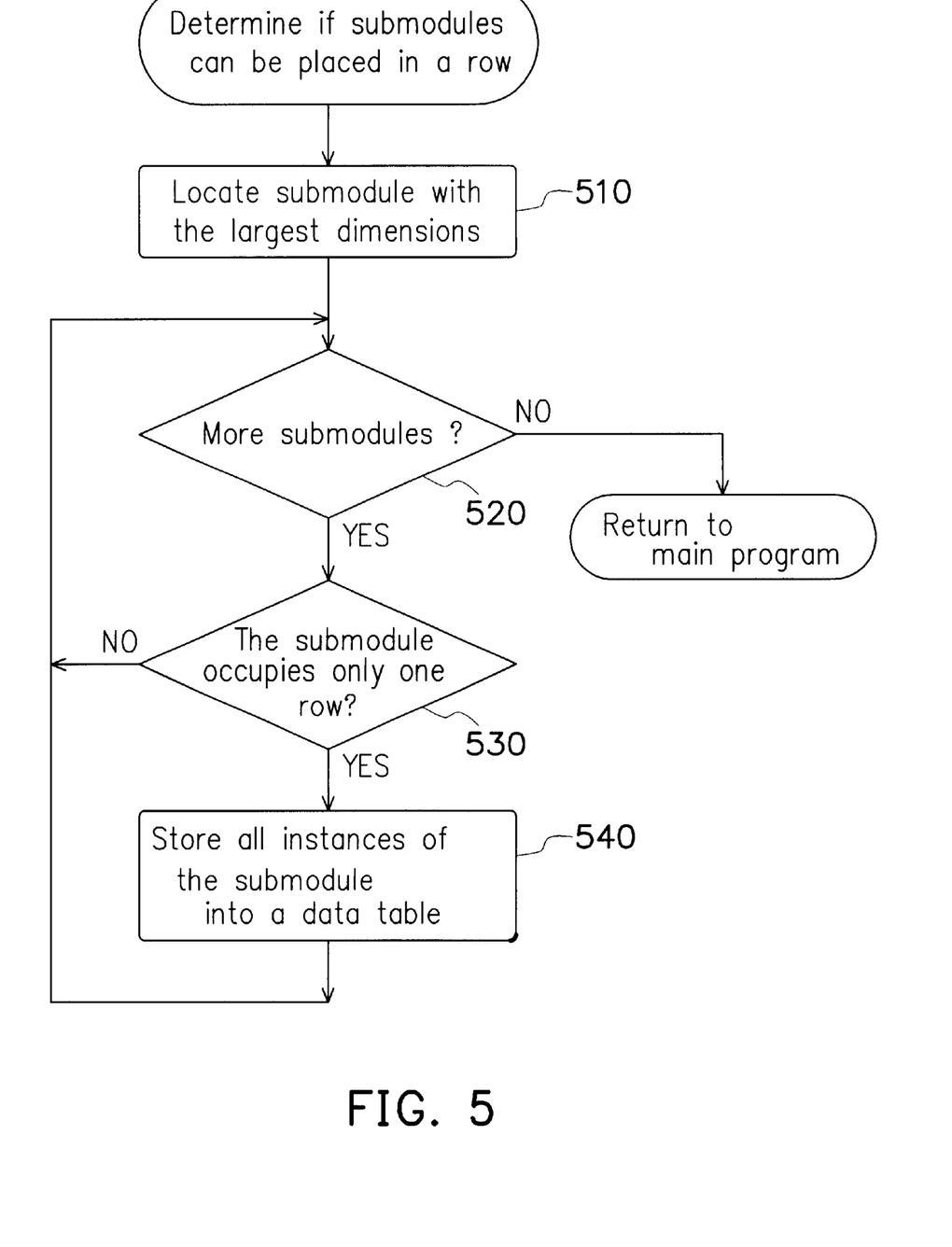
FIG. 5 is a flow chart showing the processing steps of determining if submodules can be placed in a row for the arrayed-element device in FIG. 3.
Figure 6:
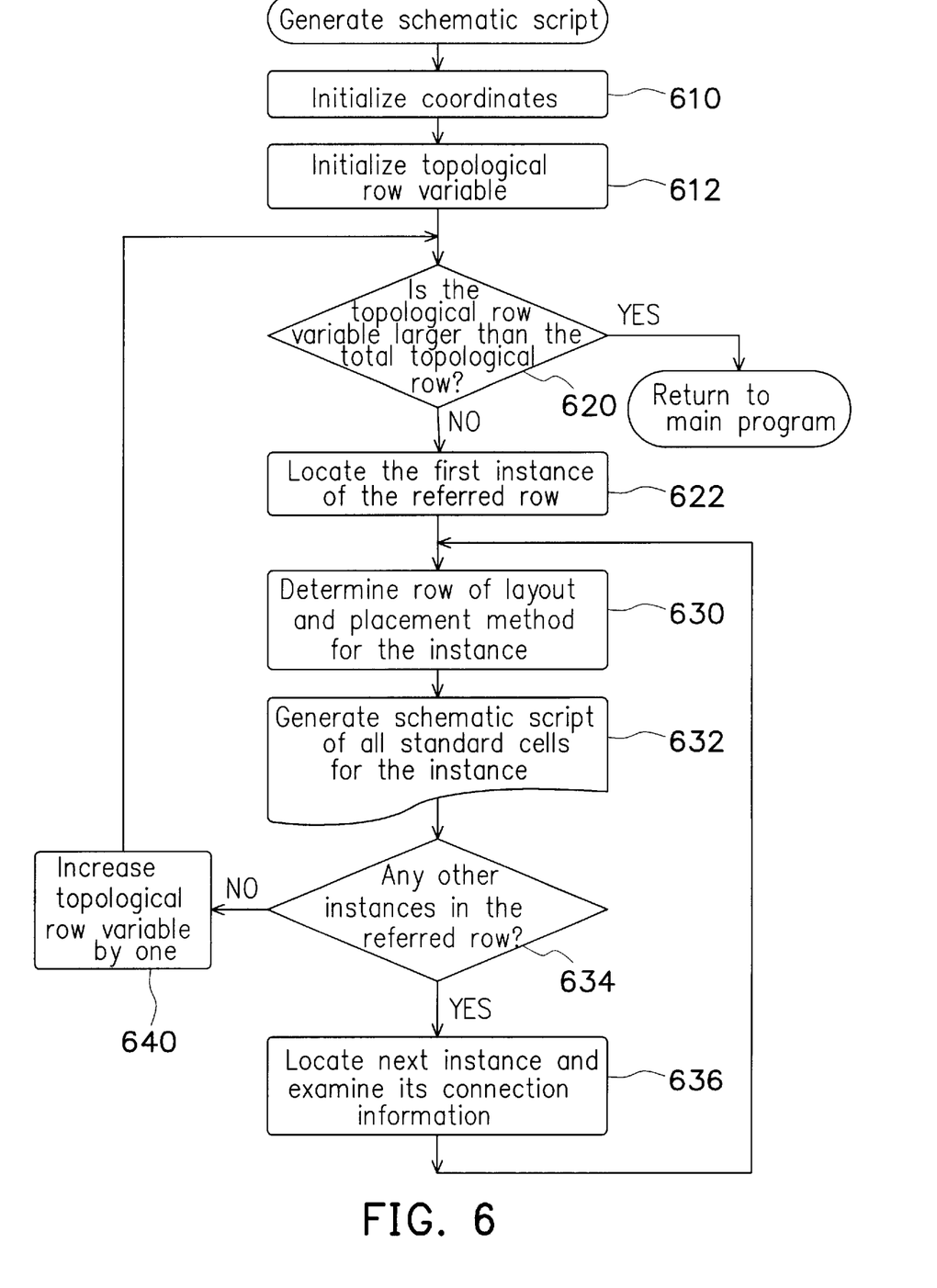
FIG. 6 is a flow chart showing the processing steps of generating a schematic script for the arrayed-element device in FIG. 3.

FIG. 3 shows the main flow chart for a method of automatic placement for an arrayed-element device according to a preferred embodiment of the present invention. FIGS. 4 to 6 are detailed flow charts of the main flow chart in FIG. 3.

As shown in FIG. 3, related parameters of the arrayed-element device are loaded (Step 310), including width of standard cells, a circuit's topological specifications, netlist, etc. The details will be further described in the following flow charts.

After the related parameters are input, the total rows required for placement of the arrayed-element device are obtained. Submodules are determined if they can placed in a row (Step 320). Finally, a schematic script describing the placement of standard cells for the arrayed-element device is generated (Step 330). The schematic script can then be loaded into an automatic P&R tool, which subsequently completes the remaining routing process for the whole IC.

FIG. 4 is a flow chart showing the processing steps of loading parameters for the arrayed-element device in FIG. 3. These parameters can be input in advance through an interfacing program and saved in a file, based on which the schematic script can be generated.

Figure 8:
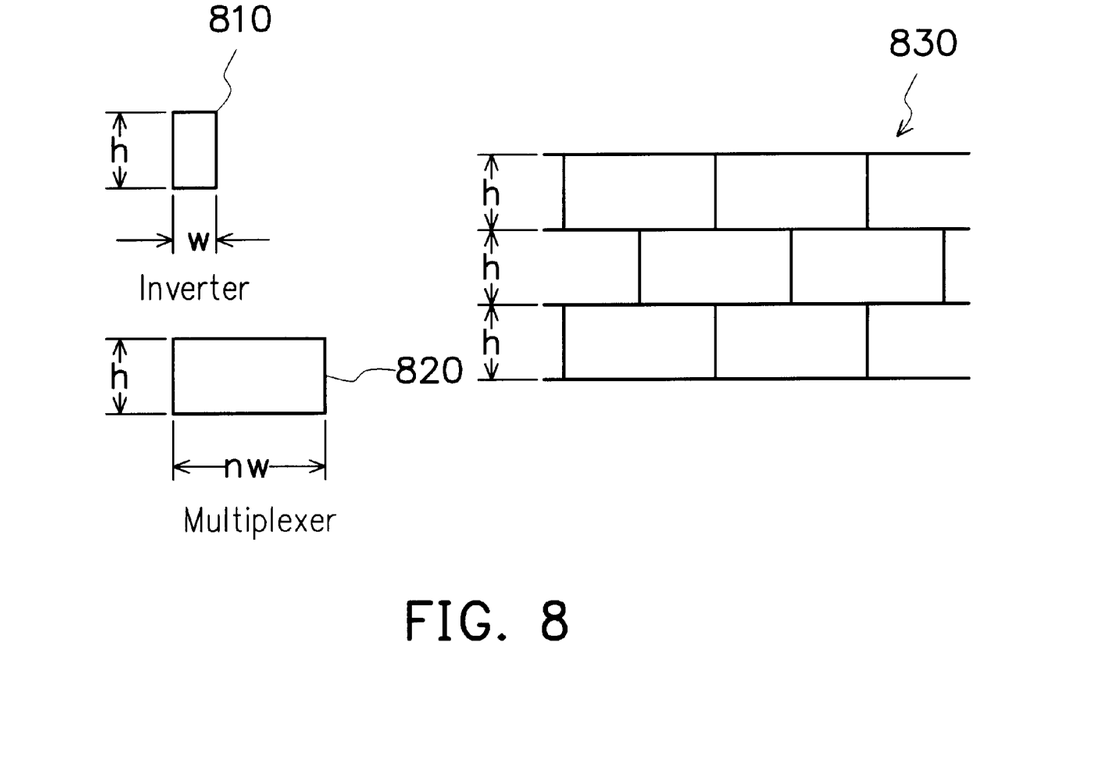
FIG. 8 is a schematic diagram showing dimensions of standard cells.

In Step 410, width information for standard cells is read in. Note that the placement is performed based on standard cells, which have an identical height but different width depending on the complexities of the standard cells. FIG. 8 is a schematic diagram showing dimensions of standard cells, in which an inverter 810 has a minimal width w and a multiplexer 820 has a width which is n times as large as that of the inverter. As shown in FIG. 8, standard cells are placed one row after another. As mentioned earlier, the standard cells in each row have the same height but different width.

In Step 420, topological specifications of the arrayed-element device, for example, origin coordinate, height of standard cells, and circuit's topological information, are read in and recorded.

Figure 7:
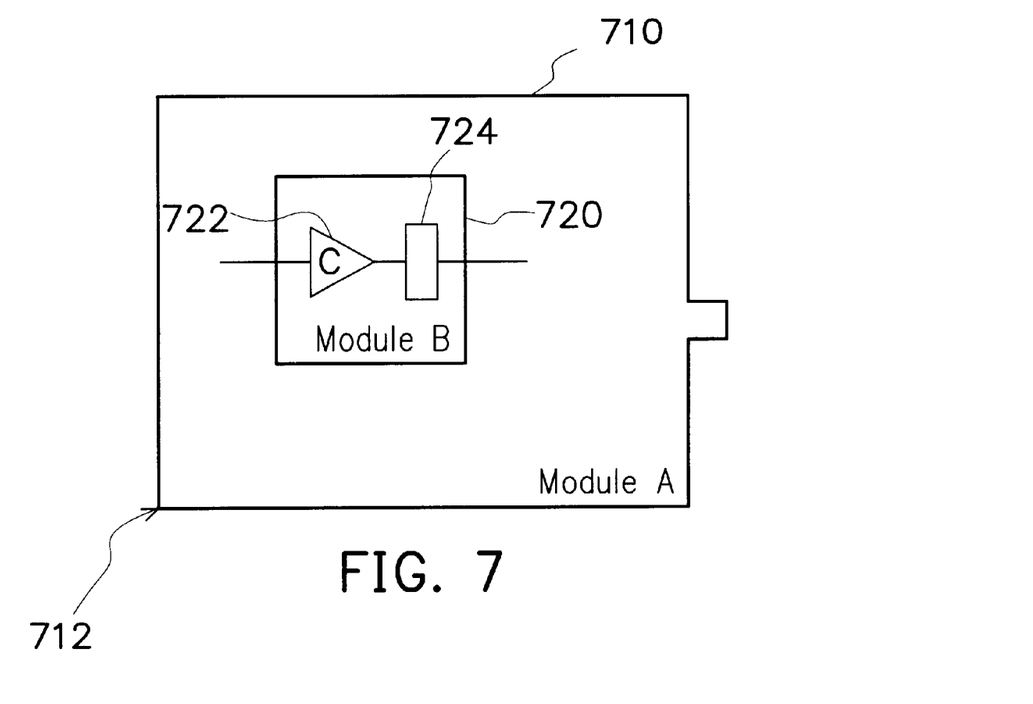
FIG. 7 is a schematic diagram showing a hierarchical structure to describe modules.

When the arrayed-element device is converted into a schematic script to feed into the automatic P&R tool, it becomes a component with a fixed coordinate positioned by a reference point in the whole circuit. As shown in FIG. 7, a module A (710) is an arrayed-element device having a reference point 712 at the bottom-left corner. Note that the bottom-left corner in FIG. 7 is for purpose of illustration, only. In practice, different reference point can be used if schematic representation or placement sequence of standard cells are different.

Circuit topology is used to describe the arrangement of the arrayed-element device. Taking the FIFO memory 100 in FIG. 1 for example, the circuit topology can be described as:

$$(D \times m) \times a$$

$$(C_1 \times (M-1) + C_2 \times 1) \times 1$$

$$(D \times m) \times b$$

where D is the data unit, standing for the stored data and the path of data flow, $C_1$ and $C_2$ represent different combinations of the control units and data units, m represents the total stages of the FIFO memory 100, i.e., the number of columns of the arrayed-element device, a and b represent the number of rows for the data units, and 1 represents a single row for the control unit. There are a (or i+1) and b (or n−i−1) rows of data units above and below the control unit, respectively.

In Step 430, a netlist for the arrayed-element device is read in and recorded. For example, connecting ports of every module, instances within a module, space required for every module, and connecting relationships between instances in a module are all read in and recorded accordingly. The information in the netlist can be used for connection checkup during the placement process.

In Step 440, the top module in the netlist is located. The netlist uses a hierarchical structure which allows a nested description of modules. That is, a module can further comprise submodules. FIG. 7 is a schematic diagram showing a hierarchical structure to describe modules. Assume that module A (710) represents an arrayed-element device and module B (720) is a submodule within the module A (710). For example, assume module A (710) is a FIFO memory and module B represents a data unit of the FIFO memory. The module B comprises a buffer C (722) and a latch 724. Thus, the module A (710) is the top module. The schematic script generated will use a path name of /A/B/C to represent the buffer C (722).

FIG. 5 is a flow chart showing the processing steps to determine if submodules can be placed in a row for the arrayed-element device in FIG. 3. The objective is to look for submodules which can be placed in one row.

Step 510 locates a submodule having the largest dimensions. The arrayed-element device comprises a plurality of stages. Each stage comprises a plurality of data units which are controlled by a control unit. The data unit has a simple structure which occupies a smaller space, while the control unit is more complicated and occupies a larger space. Therefore, the step of locating a submodule having the largest is dimensions is actually a step of locating the control unit module.

Figure 9:
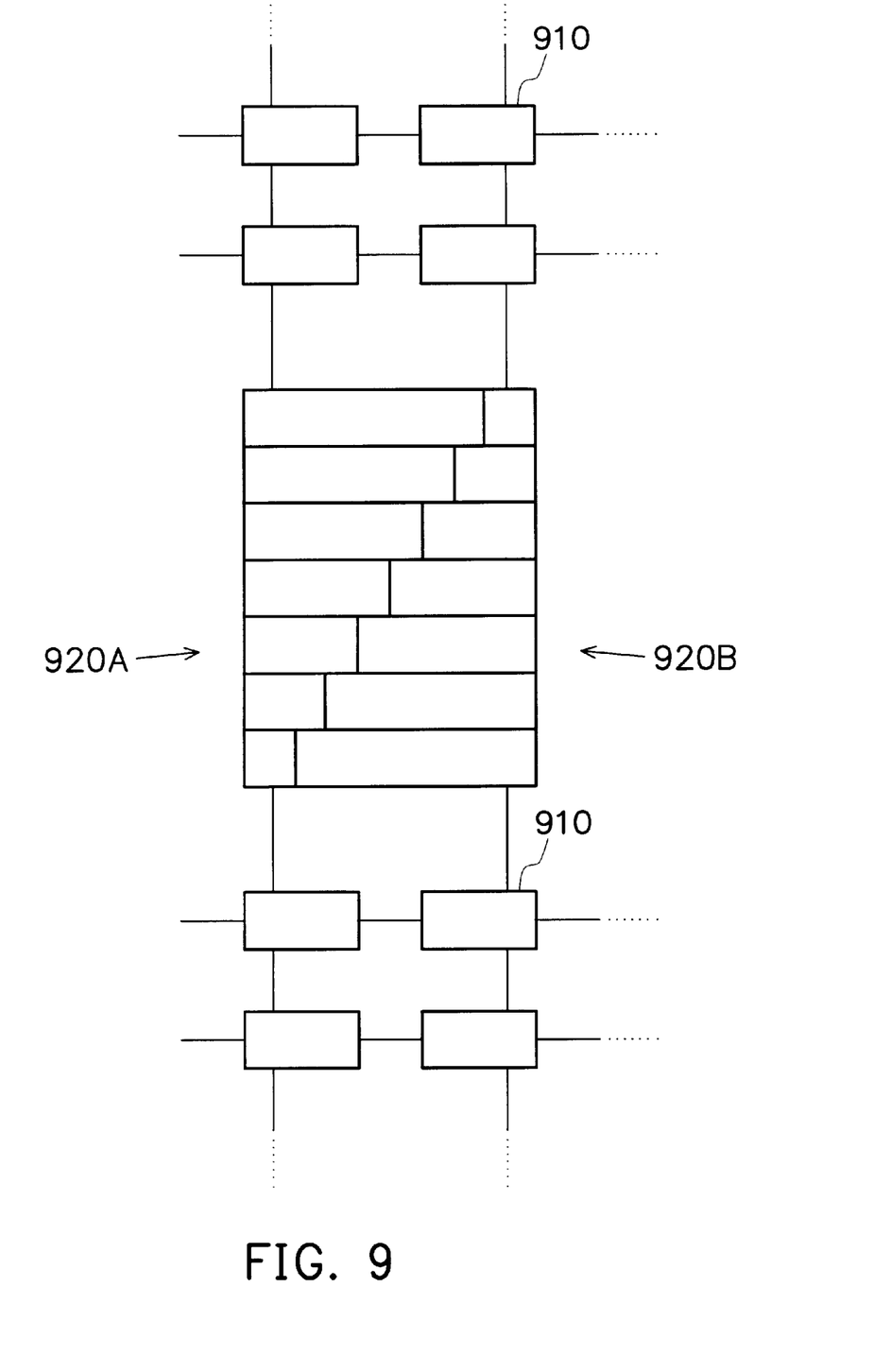
FIG. 9 is a schematic diagram showing placement of standard cells for an arrayed-element device.

FIG. 9 is a schematic diagram showing a placement of standard cells for an arrayed-element device. For illustration purposes, only two control units 920A and 920B, and two data units 910 above and below each control unit are depicted. As shown in FIG. 9, the control unit 920A controls a stage of data units while the control unit 920B controls another stage of data units in this figure.

With reference to FIG. 9, the control unit 920A occupies several rows. Standard cells of the control unit 920A are placed downward, one row after another, according to their dimensions. In contrast, standard cells of the control unit 920B are placed upward, one row after another, according to their dimensions. A data unit is always placed in one row. Since the largest cell within the control unit 920A and control unit 920B has a width which is twice as large as that of the data unit 910, the placement method has an advantage of making the control unit and data units as close as possible so as to facilitate the routing process. Thus, the total rows required for placement of the arrayed-element device can be obtained if the number of rows required for placement of the control units within the arrayed-element device is calculated.

The objective of Steps 520 through 540 is to look for submodules which occupy only one row and store them into a data table which is subsequently referenced during the step of generating the schematic script for placement. Step 520 decides if there is any other submodule available. If there is no submodule available, the program returns to the main program. If there is still a submodule as decided in Step 520, whether the submodule can be placed in one row is further decided in Step 530. If the submodule requires more than one row for placement, the program goes to Step 520 to look for other submodules within the module. If the submodule can be placed in one row as decided in Step 530, information of instances within the submodule is stored into a data table as shown in Step 540. The program then goes to Step 520 to look for other submodules. If no submodule is available, the program returns to the main program. An appropriate data structure, for example, a hash table, can be chosen for the data table, which is used to store instance information as mentioned earlier.

After the previous steps have been performed, the schematic script is ready to be generated. As shown in FIG. 6, where a flow chart to generate the schematic script is depicted.

Step 610 initializes the coordinate system. That is, the coordinate is set at the origin coordinate from the parameters loaded. During the generation of the schematic script, standard cells are placed into a row from the origin.

In Step 612, a topological row variable is initialized based on the origin coordinate. As mentioned earlier, the arrayed-element device uses the bottom-left corner as the origin where standard cells are initially placed. When the topological row variable is initialized, it refers to the row at the bottom of the arrayed-element device.

In Step 620, whether the topological row variable is larger than the total topological rows determined in the previous step is decided. When the topological row variable is larger than the total topological rows, all the standard cells have been placed and the program returns to the main program. If the topological row variable is smaller than or equal to the total topological rows, the following steps are performed.

In Step 622, the first instance of the topological row that the topological row variable refers to is located for placement. Steps 630 to 636 describe the placement process of instances within the topological row that the topological row variable refers to.

Step 630 determines the number of layout rows required and placement method for the instance. As mentioned earlier, the data units are placed in one row while the control unit is placed across several neighboring rows according to their dimensions. Thus, a minimum space for placement is required for the arrayed-element device.

In Step 632, placement information of all standard cells for the instance is generated and stored into a schematic script required by the automatic routing program.

When the instance is processed in Step 632, a decision is made in Step 634 whether there exist any other instances in the topological row that the topological row variable refers to. If there is no instance available, the program exits the loop 630~636 and goes to Step 640 where the topological row variable is increased by 1. A decision is then made again in Step 620 if the placement has been completed for all standard cells of the arrayed-element device.

If another instance in the topological row that the topological row variable refers to in Step 634 is still available, the next instance is located and its connection information is examined to prevent errors so that the placement can be performed for the instance in Step 630.

According to the preferred embodiment of the present invention, the method of automatic placement for the arrayed-element device can automatically generate a schematic script based on preset parameters of a circuit's topology, netlist, and other parameters, etc. The schematic script is loaded into an automatic P&R tool to perform the automatic routing which allows an RC extraction for the arrayed-element device. Therefore, time frame required for manual P&R and file format conversion can be significantly reduced and therefore the developing time is reduced, as well.

As a summary, the method of automatic placement for an arrayed-element device according to the preferred embodiment of the present invention has the following advantages:

1. Standard cells of the arrayed-element device are automatically placed. No manual placement of standard cells is required for the arrayed-element device so that the time required for manual P&R is significantly reduced to shorten the product developing cycle.
2. The schematic script generated for the arrayed-element device adopts a format which can be accepted by the automatic P&R tool directly, so that an automatic routing becomes possible. Furthermore, an RC extraction can be undertaken after the routing process is completed without the need to create an interchanging file format. The effort and time frame required are significantly reduced, and therefore the product developing cycle is shortened, as well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of automatic placement for an arrayed-element device by using standard cells which are placed into rows, the method comprising the steps of:
    loading parameters of the arrayed-element device;
    determining if submodules can be placed in a row for the arrayed-element device; and
    generating a schematic script.

2. The method of claim 1, wherein the step of loading parameters of the arrayed-element device comprises the steps of:
    reading in width information of the standard cells;
    reading in topological specifications of the arrayed-element device;
    reading in a netlist which comprises information of modules constructed by a plurality of instances; and
    locating a top module from the netlist.

3. The method of claim 2, wherein the step of reading in topological specifications of the arrayed-element device further comprises:
    recording an origin coordinate;
    recording height information of the standard cells; and
    recording topological information of the arrayed-element device.

4. The method of claim 2, wherein the step of reading in a netlist further comprises the steps of:
    recording connecting ports of every module;
    recording instances within a module;
    recording space required for every module; and recording connecting relationships between instances.

5. The method of claim 1, wherein the step of determining if submodules can be placed in a row for the arrayed-element device comprises:
    locating a submodule with the largest dimensions within the module;
    deciding whether other submodules exist;
    deciding if the submodule occupies only one row;
    returning to the step of deciding whether there exist other submodules if the submodule occupies more than one row; and
    storing all instances of the submodule into a data table if the submodule occupies only one row and then returning to the step of deciding whether other submodules exist.

6. The method of claim 1, wherein the step of generating a schematic script comprises the steps of:
    initializing a coordinate;
    initializing a topological row variable;
    deciding whether the topological row variable is larger than the total topological rows;
    performing the following steps if the topological row variable is smaller than or equal to the total topological rows:
    locating a first instance of the topological row that the topological row variable refers to;
    determining what number of layout rows is required and a placement method for the instance;
    generating the schematic script of all standard cells for the instance;
    deciding whether there exist any other instances in the row referred to by the topological row variable;
    increasing the topological row variable by one and then returning to the step of deciding whether the topological row variable is larger than the total topological rows if there exists no other instances in the topological row referred to by the topological row variable; and
    locating a next instance and examining the connection relationship of the next instance if there exists an instance in the topological row referred to by the topological row variable and then returning to the step of determining what number of layout rows is required and a placement method for the instance.

7. A method of automatic placement for an arrayed-element device that uses standard cells which are placed into rows to generate a schematic script based on topological specifications of the arrayed-element device and a netlist, the method comprising the steps of:

determining if submodules can be placed in a row for the arrayed-element device according to the topological specifications of the arrayed-element device and the netlist; and generating placement information for all the standard cells of the arrayed-element device to the schematic script according to the topological specifications of the arrayed-element device.

8. The method of claim 7, wherein the step of generating placement information for all the standard cells of the arrayed-element device to the schematic script further comprises the steps of:

initializing a topological row variable;

deciding whether the topological row variable is larger than the total topological rows;

performing the following steps if the topological row variable is smaller than or equal to the total topological rows:

locating a first instance of the topological row that the topological row variable refers to;

determining what number of layout rows is required and a placement method for the instance;

generating all standard cells for the instance;

deciding whether there exist any other instances in the topological row referred to by the topological row variable;

increasing the topological row variable by one and then returning to the step of deciding whether the topological row variable is larger than the total topological rows if there exists no other instances in the topological row referred to by the topological row variable; and locating a next instance and examining the connection relationship of the next instance if there exists an instance in the topological row referred to by the topological row variable and then returning to the step of determining what number of layout rows is required and a placement method for the instance.

* * * * *